United States Patent
Kaneyama

(10) Patent No.: US 6,761,302 B1
(45) Date of Patent: Jul. 13, 2004

(54) DEVICE MOUNTING METHOD

(75) Inventor: Yoshinobu Kaneyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/198,849

(22) Filed: Nov. 24, 1998

(30) Foreign Application Priority Data

Nov. 27, 1997 (JP) .............................. 9-326154

(51) Int. Cl.[7] .......................... B23K 1/06; B23K 20/10; B23K 5/20
(52) U.S. Cl. ................. 228/111.5; 228/110.5; 228/36
(58) Field of Search .................. 228/111.5, 110.1, 228/36, 33, 40, 180.1, 180.21, 179.1, 245, 203; 118/423

(56) References Cited

U.S. PATENT DOCUMENTS

| | | | | |
|---|---|---|---|---|
| 4,763,829 A | * | 8/1988 | Sherry | 228/124 |
| 4,990,462 A | * | 2/1991 | Sliawa, Jr. | 437/51 |

FOREIGN PATENT DOCUMENTS

| | | | |
|---|---|---|---|
| JP | 16902 | * | 2/1979 |
| JP | 6070736 | | 4/1985 |
| JP | 197112 | * | 8/1989 |
| JP | 3-60134 | | 3/1991 |
| JP | 3060134 A | * | 3/1991 |
| JP | 58169068 | | 10/1993 |

* cited by examiner

*Primary Examiner*—M. Alexandra Elve
(74) *Attorney, Agent, or Firm*—Dickstein, Shapiro, Morin & Oshinsky, LLP.

(57) ABSTRACT

When a substrate electrode (6) formed on a semiconductor substrate (5) and a device electrode (14) formed on an optical device (13) are joined to each other by solder to mount the device (13) on the substrate (5), a solder piece attached to the substrate electrode (6) is melted in inactive liquid (9) to form a solder bump (12). The substrate electrode (6) on which the solder bump (12) is formed and the device electrode (14) are matched with each other, and the device (13) is disposed so as to confront the substrate (5) in the inactive liquid (9). Thereafter, when the solder bump (12) is melted in the inactive liquid (9) and ultrasonic vibration (11) is applied to join the device electrode (6) and the substrate electrode (14) to each other, the positioning of the device electrode (14) to the substrate electrode (6) is performed by the surface tension of the melted solder bump (12), and then the solder bump (12) is solidified.

40 Claims, 5 Drawing Sheets

DEVICE MOUNTING METHOD

BACKGROUND OF THE INVENTION

1. Field of the Invention

The present invention relates to a method of mounting a device such as an optical device or the like, and particularly to a method of positioning and mounting a device such as an optical device or the like to a substrate by using solder bumps.

2. Description of the Related Art

As disclosed in TECHNICAL REPORT IEICE, OQE93-145 (1993-12), such a method of mounting the optical device on the substrate has been used to fix the optical device with high positioning precision in an optical communication module.

FIGS. 1A to 1C and FIGS. 2A to 2C are diagrams showing a series of steps for a conventional method of mounting an optical device.

A circular substrate electrodes 6 of 50 $\mu$m in diameter are formed on the surface of a silicon substrate 5 to join an optical device 13 of 300 $\mu$m square to the surface of the silicon substrate 5. A die 1 and a punch 2 are used to punch a solder sheet 3 to thereby obtain solder pieces 4. A heater 8 is embedded in a heater table 16, and a flux 15 is used to remove an oxide film on the surface of the solder pieces 4 when the soldering pieces 4 are melted. The solder pieces 4 are melted and the shape thereof is varied, thereby forming solder bumps 12. Circular optical device electrodes 14 of 50 $\mu$m in diameter which are formed on the optical device 13 are joined to the substrate electrodes 6 through the solder bumps 12.

Next, the operation of each step will be described.

As shown in FIG. 1A. the solder pieces 4 which are punched out from the solder sheet 3 by the die 1 and the punch 2 are bumped against the substrate electrodes 6 formed on the silicon substrate 5. Subsequently, as shown in FIG. 1B, the silicon substrate 5 against which the solder pieces 4 are bumped is mounted on the heater table 16 in which the heater 8 is embedded. The flux 15 is coated on the solder pieces 4. Thereafter, the solder pieces 4 are heated by the heater 8 to be melted, and the oxide films on the surface of the soldering pieces are removed by the flux 15, thereby forming the solder bumps 12 under surface tension as shown in FIG. 1C. Thereafter, the substrate 5 is washed to remove the residues of the flux 12. The substrate from which the residues of the flux 12 are removed is mounted on the heater table 16 again as shown in FIG. 2A.

Thereafter, the optical device 13 is temporarily mounted so that the optical device electrodes 14 formed on the optical device are positioned onto the solder bumps 12. At this time, as show in FIG. 2A, the center of each substrate electrode 6 and the center of each optical device electrode 14 are normally displaced from each other by 10 $\mu$m or more due to positional displacement at the mount time. Subsequently, the atmospheric air around the silicon substrate 5 and the optical device 13 is replaced by nitrogen to reduce the oxygen concentration to 10 ppm or less.

When the silicon substrate 5 is heated by the heater 8 to melt the solder bumps 12 as shown in FIG. 2B, the melted solder bumps 12 start to deform to the shape in which the surface area is minimized by the surface tension. As a result, the optical device 13 is shifted due to the deformation of the solder bumps 12, and the optical device 13 stops its movement at the position where the center of each substrate electrode 6 is coincident with the center of each optical device electrode 14. Thereafter, the silicon substrate 5 is cooled to solidify the solder bumps 12, whereby the optical device 13 is fixed with high positioning precision. The positional displacement amount between the center of the optical device electrode 14 and the center of the substrate electrode 6 at this time is equal to about 2 $\mu$m or less.

A first problem of the conventional method of mounting such a device as the optical device as described above or the like resides in that an atmosphere of an extremely low oxygen concentration is required. It takes a long time to reduce the oxygen concentration of the atmosphere to 10 ppm or less, and also a device for controlling the oxygen concentration is very expensive. The reason for this is as follows. That is, in order to melt solder in the air, flux must be used or the oxygen concentration must be reduced to an extremely low level. From the viewpoint of reliability, it is not preferable to use flux for a device such as an optical device or the like, and thus the oxygen concentration must be managed to be set to a very low level.

A second problem resides in that it is impossible to mount a large and heavy optical device with high positioning precision because the solder bumps are crushed flat. This is because any consideration of reducing the force applied to the melted solder bumps in accordance with the weight of the optical device is not taken.

SUMMARY OF THE INVENTION

Therefore, an object of the present invention is to provide a mount method of fixing a device such as an optical device or the like onto a substrate with high positioning precision without managing the oxygen concentration.

Another object of the present invention is to provide a mount method of fixing a device such as a large and heavy optical device or the like with high positioning precision by minute solder bumps.

In order to attain the above objects, according to the present invention, a mount method for joining a device to a substrate with soldering is characterized in that the joint of the device and the substrate through solder is performed in liquid.

In the above mount method, the joint based on the soldering is performed while ultrasonic vibration is applied to the solder through the liquid.

Further, in order to attain the above object, according to the present invention, a method of joining a substrate electrode formed on a substrate and a device electrode formed on a device to each other by soldering to mount the device on the substrate, is characterized by comprising the steps of: attaching a solder piece to the substrate electrode; melting the solder piece in liquid to form a solder bump; matching the substrate electrode having the solder bump formed thereon with the device electrode and disposing the device so as to confront the substrate in the liquid; positioning the device electrode to the substrate electrode by the surface tension of the melted solder bump when the solder bump is melted in the liquid to join the device electrode and the substrate electrode to each other; and then solidifying the solder bump.

In the above mount method, when the solder piece is melted to form the solder bump, ultrasonic vibration is applied to the solder piece through the liquid.

In the above mount method, when the solder bump is melted in the liquid to join the device electrode and the substrate electrode to each other, ultrasonic vibration is applied to the solder bump through the liquid.

In the mount method of the present invention, the liquid is inactive to the device and the substrate, and further inactive to the solder.

In the mount method of the present invention, the device is an optical device, and the substrate is a semiconductor substrate.

The mount method of the present invention contains a step of melting the solder in inactive liquid. More specifically, the mount method of the present invention contains a step of heating the substrate and the device to be joined to each other by the solder while the substrate and the device are immersed in inactive liquid.

Further, the mount method of the present invention is characterized by containing a step of applying ultrasonic vibration to the surface of the melted solder when the solder is melted, thereby breaking the oxide film on the surface of the melted solder. More specifically, the mount method of the present invention contains a step of transmitting the ultrasonic vibration generated by ultrasonic wave generator through the inactive liquid serving as a medium to the surface of the melted solder.

According to the present invention, since the device such as an optical device or the like, the substrate and the solder are immersed in the liquid, the ultrasonic vibration can be transmitted through the liquid to the melted solder. Therefore, the oxide film on the surface of the melted solder can be broken. Further, since these elements are located in the liquid, no oxygen exists around the solder. Therefore, even when the solder is melted, the surface of the solder is not oxidized. Accordingly, the surface tension of the solder can exhibit its maximum effect, and the automatic positioning and mounting operation using the surface tension of the solder can be performed. In addition, the adhesion performance of the solder is excellent.

Since the device such as the optical device or the like is immersed in the liquid, buoyancy occurs, and the device becomes substantially light. Therefore, buoyancy is applied to a large heavy device and thus it becomes light. Accordingly, it can be sufficiently supported by melted solder bump which is easily crushed flat in the air. Therefore, such a large and heavy device that cannot be mounted in the air can be automatically positioned and mounted by using the surface tension of the solder.

DETAILED DESCRIPTION OF THE PREFERRED EMBODIMENT

Figure 1A:
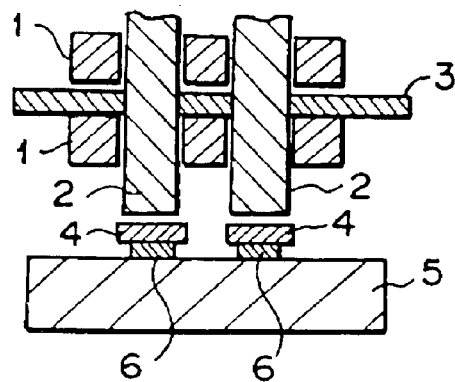
FIGS. 1A to 1C are diagrams showing a series of steps of a conventional method of mounting an optical device.
Figure 1B:
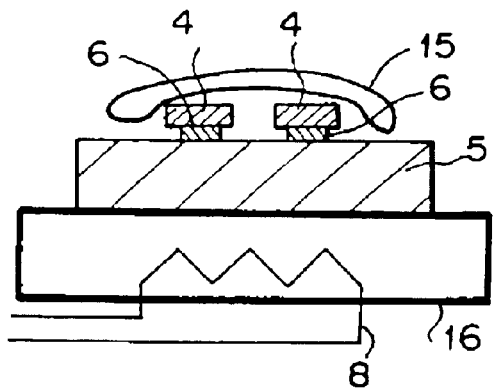
Figure 1C:
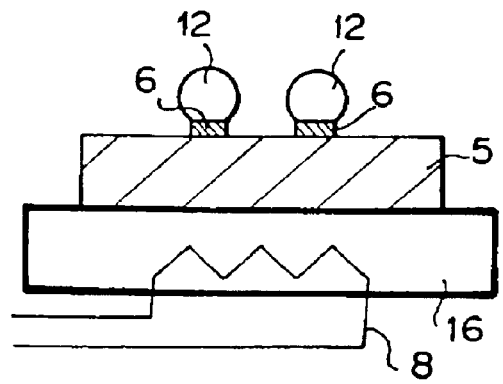
Figure 2A:
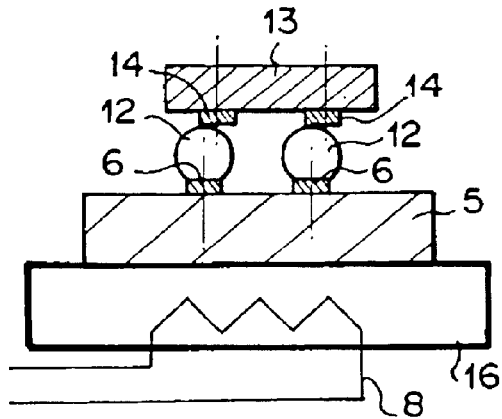
FIGS. 2A to 2C are diagrams showing a series of steps of a conventional method of mounting an optical device.
Figure 2B:
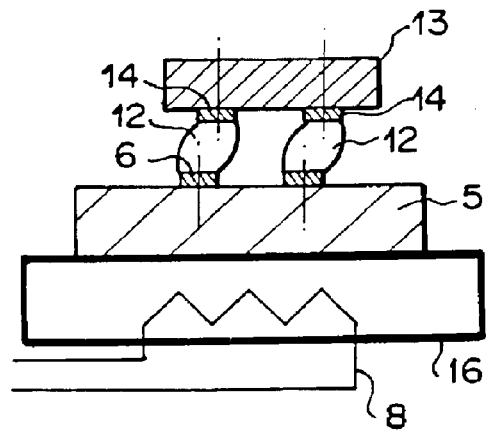
Figure 2C:
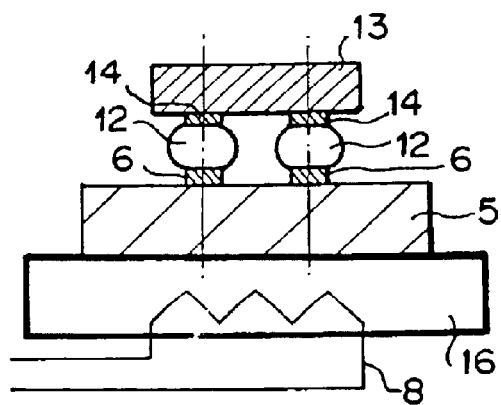

A preferred embodiment according to the present invention will be described hereunder with reference to the accompanying drawings.

FIGS. 3A to 3C and FIGS. 4A to 4C are diagrams showing a series of steps for a device mount method of an embodiment according to the present invention.

Referring to FIGS. 3A to 3C and FIGS. 4A to 4C, circular substrate electrodes 6 of 10 $\mu$m to 200 $\mu$m in diameter to join an optical device 13 to the surface of a substrate 5 are formed on the substrate 5. A die 1 and a punch 2 are used to punch a solder sheet 3 to form solder pieces 4. The solder pieces 4 are melted and deformed in shape to obtain solder bumps 12. Optical device electrodes 14 of 10 $\mu$m to 200 $\mu$m in diameter which are formed on the optical device 13 are to be joined to the substrate electrodes 6 through the solder bumps 12. An ultrasonic wave generator 10 for generating ultrasonic vibration and a heater 8 are secured to a container 7. As the ultrasonic wave generator 10 may be used an ultrasonic wave generator attached to an ultrasonic cleaning machine which is sold in the market and used to clean eyeglasses or other members. The ultrasonic vibration 11 generated by the ultrasonic wave generator 10 is propagated through inactive liquid 9 serving as a medium filled in the container 7. The inactive liquid 9 is inactive liquid which has no effect on the optical device 13 and the substrate 5, and it may be formed of organic compound of perfluorotrialkylamine group $(C_nF_{2n+1})_3N$ or the like. The inactive liquid 9 being used has a boiling point higher than a melting point of the solder bump 12. Further, a solder material must be suitably selected so that the melting point thereof is lower than the boiling point of the inactive liquid 9. For example, a combination of bismuth-tin based solder BiSn (Bi 52 wt %, Sn 48 wt %) having a melting point of 138.5° C. and inactive liquid $(C_5F_{11})_3N$ having a boiling point of 215° C. may be considered.

Figure 5:
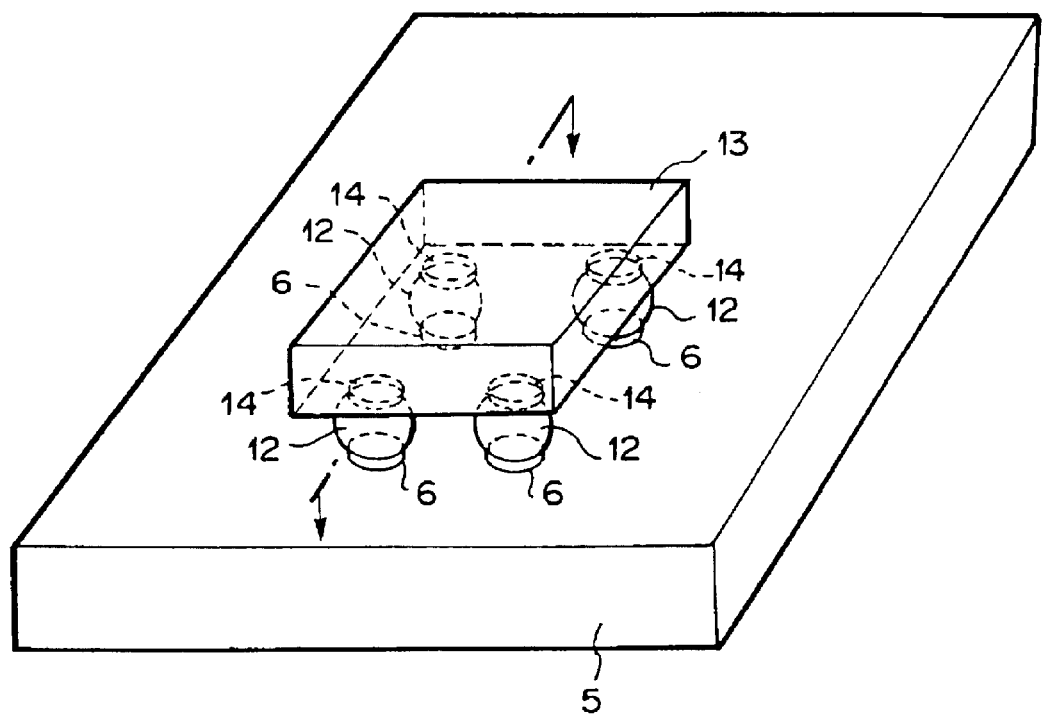
FIG. 5 is a diagram showing an example of a substrate and a device which are mounted according to the method of the present invention.

FIG. 5 is a perspective view showing a product which is fabricated by the present invention.

Referring to FIG. 5, the circular substrate electrodes 6 formed on the substrate 5 and the circular optical device electrodes 14 formed on the optical device 13 are joined to each other through the solder bumps 12. These elements are positioned and fixed so that the center of each optical device electrode 14 is located just above the center of each substrate electrode 6.

Next, the steps of FIGS. 3A to 3C and FIGS. 4A to 4C will be described.

Figure 3A:
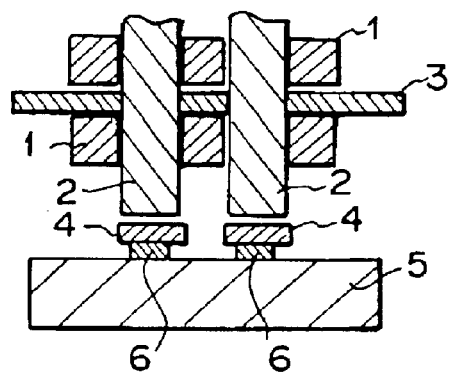
FIGS. 3A to 3C are diagrams showing a series of steps of a mount method according to the present invention.
Figure 3B:
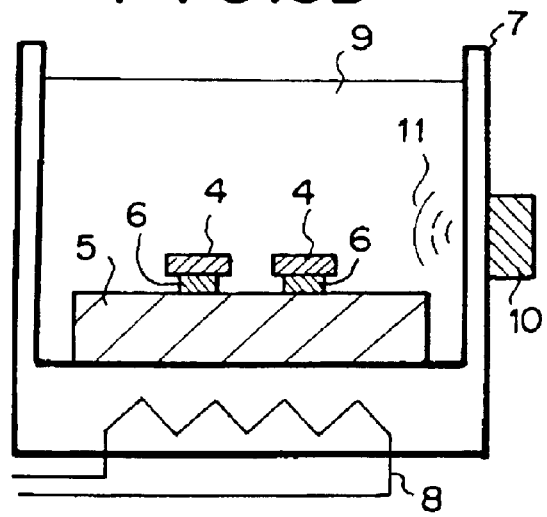
Figure 3C:
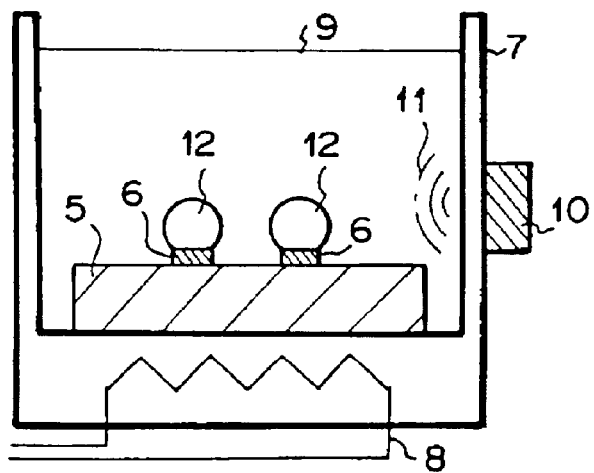

As shown in FIG. 3A, the solder sheet 3 is punched by the die 1 and the punch 2 to form the solder pieces 4. The solder pieces 4 thus formed are bumped against the substrate electrodes 6 formed on the substrate 5. As shown in FIG. 3B, the substrate 5 against which the solder pieces 4 are bumped is disposed at the bottom portion of the container 7 in which the inactive liquid 9 is filled. The substrate 5 is heated by the heater 8 to melt the solder pieces 4. At this time, the ultrasonic vibration 11 generated by the ultrasonic wave generator 10 minutely vibrates the surfaces of the melted solder pieces 4 through the inactive liquid 9 serving as medium and breaks the oxide films on the surfaces of the solder pieces 4. Therefore, as shown in FIG. 3C, the solder bumps 12 can be formed from the solder pieces 4 without using flux.

Figure 4A:
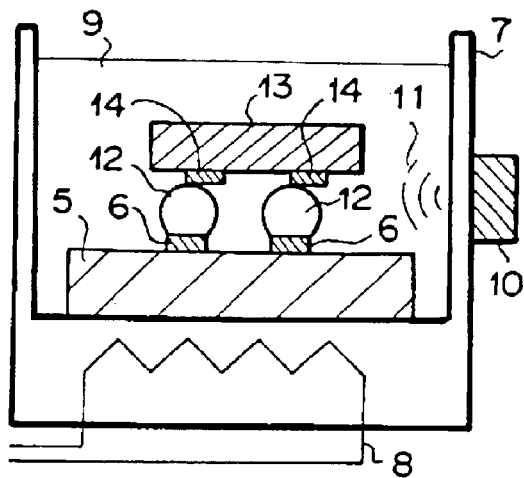
FIGS. 4A to 4C are diagrams showing a series of steps of a mount method according to the present invention.
Figure 4B:
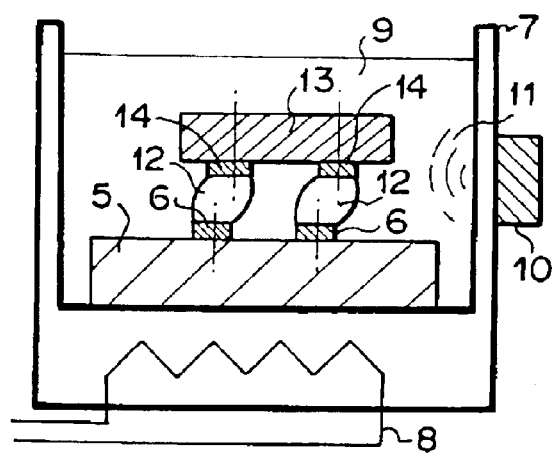

Subsequently, as shown in FIG. 4A, the optical device 13 is temporarily mounted on the solder bumps 12 thus formed. At this time, the optical device 13 is temporarily mounted so that the center of each electrode 14 formed on the optical device 13 is located just above the center of each electrode 6 formed on the substrate 5, however, the positional displacement of 10 $\mu$m or more occurs normally due to dispersion of the mount precision. Subsequently, as shown in FIG. 4B, the substrate 5 is heated by the heater 8 to melt the solder bumps 12, and at the same time the ultrasonic wave 11 generated by the ultrasonic wave generator 10 is propagated through the inactive liquid 9 to minutely vibrate the surfaces of the solder bumps 12. Therefore, the oxide films on the surfaces of the melted solder bumps 12 are broken and the melted solder exhibits its surface tension at maximum. Therefore, the melted solder starts to deform to such a shape that the surface area thereof is minimum, and the optical device 13 is also moved due to the deformation.

Figure 4C:
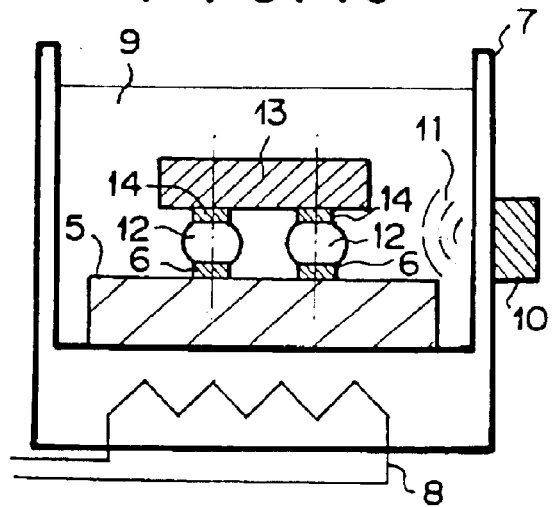

At this time, as shown in FIG. 4C, the optical element 13 moves to the position where the center of each optical device electrode 14 is located just above the center of each substrate electrode 6, and stopped there. Thereafter, the solder bumps 12 are cooled and solidified to fix the optical device 13 to the substrate 5.

In the present invention, as the device a semiconductor device may be used, and as the substrate a substrate for mounting an electric element such as a ceramic substrate, printed circuit board, and the like may be used.

A first effect of the present invention resides in that the solder between the device and the substrate can be performed with no management of oxygen concentration. This is because the substrate and the device are immersed in liquid and the ultrasonic vibration is applied to the surface of the solder.

A second effect of the present invention resides in that even a heavy device can be automatically positioned and mounted by using the surface tension of solder. This is because the positioning and mounting operation is carried out in liquid and thus the force applied to the melted solder is reduced by the amount corresponding to the buoyancy applied to the device and the melted solder.

A third effect of the present invention resides in that no flux is required for soldering. This is because the solder is melted in liquid and ultrasonic vibration is applied to the surface of the solder.

What is claimed is:

1. A method of joining a substrate electrode formed on a substrate and a device electrode formed on a device to each other by solder to mount said device on said substrate, the method comprising:

attaching a solder piece to said substrate electrode;

melting said solder piece while said solder piece is at least partially submerged in a liquid to form a solder bump having an adhered surface and an opposite surface;

positioning said device electrode so as to contact said opposite surface of said solder bump such that the center of said device electrode is not aligned with the center of said substrate electrode while said device is at least partially submerged in said liquid;

aligning the center of said device electrode with the center of said substrate electrode by surface tension of said solder bump when said solder bump is melted and while said device is at least partially submerged in said liquid and at least partially supported by a buoyant force thereby joining said device electrode and said substrate electrode to each other; and solidifying said solder bump.

2. The method as claimed in claim 1, wherein as said solder piece is melted to form said solder bump, a vibration is applied to said solder piece while said solder piece is at least partially submerged in said liquid.

3. The method as claimed in claim 1, wherein when said solder bump is melted while said solder bump is at least partially submerged in said liquid to join said device electrode and said substrate electrode to each other, a vibration is applied to said solder bump while said device is at least partially submerged in said liquid.

4. The method as claimed in claim 1, wherein said liquid is inactive to said solder, said device and said substrate.

5. The method as claimed in claim 1, wherein said device is an optical device.

6. The method as claimed in claim 1, wherein said device is a semiconductor device.

7. The method as claimed in claim 1, wherein said substrate is a semiconductor substrate.

8. The method as claimed in claim 1, wherein said substrate is a substrate for mounting an electric element.

9. The method as claimed in claim 1, wherein said substrate is a ceramic substrate.

10. The method as claimed in claim 1, wherein said substrate is a printed circuit board.

11. The method as claimed in claim 2, wherein said vibration is applied ultrasonically.

12. The method as claimed in claim 3, wherein said vibration is applied ultrasonically.

13. The method as claimed in claim 12, wherein said vibration is applied ultrasonically through said liquid to said solder bump disposed in said liquid.

14. The method as claimed in claim 13, wherein an oxide film on the surface of said solder bump is broken to enhance the surface tension when said solder bump is melted.

15. A method of joining a device to a substrate having a solder piece electrically coupled to an electrode of the substrate, the method comprising:

placing the substrate in a liquid;

melting the solder piece to form a solder bump while the substrate is in the liquid;

placing a device having a device electrode on the solder bump while the device is in the liquid such that the device electrode is out of alignment with the substrate electrode; and melting the solder bump so as to cause the device electrode to align with the substrate electrode while the device and the substrate are in the liquid.

16. The method as claimed in claim 15, wherein a center of the device electrode is out of alignment with a center of the substrate electrode during the placing of the device on the solder bump.

17. The method as claimed in claim 16, wherein the device is buoyantly supported by the liquid during the melting of the solder bump.

18. The method as claimed in claim 17, wherein the center of the device electrode and the center of the substrate electrode are aligned with each other during the melting of the solder bump.

19. The method as claimed in claim 15, further comprising:

applying a vibration to the solder piece during the melting thereof.

20. The method as claimed in claim 19, wherein the vibration is an ultrasonic vibration.

21. The method as claimed in claim 19, wherein the vibration is applied to the solder piece through the liquid.

22. The method as claimed in claim 19, wherein the vibration is applied to the solder piece in an amount sufficient to break an oxide film formed on the surface of the solder piece.

23. The method as claimed in claim 19, further comprising:

applying a vibration to the solder bump during the melting thereof.

24. The method as claimed in claim 23, wherein the vibration is an ultrasonic vibration.

25. The method as claimed in claim 23, wherein the vibration is applied to the solder bump through the liquid.

26. The method as claimed in claim 23, wherein the vibration is applied to the solder bump in an amount sufficient to break an oxide film formed on the surface of the solder bump.

27. The method as claimed in claim 23, wherein the vibration is applied to the solder bump in an amount sufficient to increase a surface tension of the solder bump.

28. The method as claimed in claim 27, wherein the amount of vibration applied to the solder bump is sufficient to cause the surface tension of the solder bump to reach a maximum.

29. The method as claimed in claim 23, wherein the vibration is applied to the solder bump in an amount sufficient to deform the solder bump.

30. The method as claimed in claim 29, wherein the deformation of the solder bump causes the alignment of the device electrode with the substrate electrode.

31. The method as claimed in claim 15, further comprising:
 solidifying the solder bump to fix the device to the substrate.

32. The method as claimed in claim 15, wherein the liquid is inactive to the device and the substrate.

33. The method as claimed in claim 15, wherein the device is an optical device.

34. The method as claimed in claim 15, wherein the device is a semiconductor device.

35. The method as claimed in claim 15, wherein the substrate is a semiconductor substrate.

36. The method as claimed in claim 15, wherein the substrate is substrate for mounting an electric element.

37. The method as claimed in claim 15, wherein the substrate is a ceramic substrate.

38. The method as claimed in claim 15, wherein the substrate is a printed circuit board.

39. A method of joining a plurality of substrate electrodes formed on a substrate and a plurality of respective device electrodes formed on a device to each other by solder to mount said device on said substrate, the method comprising:
 attaching a respective solder piece to each of said plurality of substrate electrodes;
 melting each said respective solder piece while each said respective solder piece is at least partially submerged in a liquid to form respective solder bumps having an adhered surface and an opposite surface;
 positioning said plurality of respective device electrodes so as to contact said opposite surface of said respective solder bumps such that the centers of said plurality of respective device electrodes are not aligned with the respective centers of said plurality of substrate electrodes while said device is at least partially submerged in said liquid;
 aligning the centers of said plurality of respective device electrodes with the respective centers of said plurality of substrate electrodes by surface tension of said respective solder bumps when said respective solder bumps are melted and while said device is at least partially submerged in said liquid and at least partially supported by a buoyant force thereby joining said plurality of substrate electrodes and said plurality of respective device electrodes to each other; and
 solidifying said respective solder bumps.

40. A method of joining a device to a substrate, the substrate having a plurality of solder pieces electrically coupled to a plurality of substrate electrodes, the method comprising:
 placing the substrate in a liquid;
 melting the plurality of solder pieces to form a plurality of solder bumps while the substrate is in the liquid;
 placing a device having a plurality of respective device electrodes on the plurality of solder bumps while the device is in the liquid such that the plurality of respective device electrodes are out of alignment with a respective substrate electrode of the plurality of substrate electrodes; and
 melting the plurality of solder bumps so as to cause the plurality of
 respective device electrodes to align with the plurality of respective
 substrate electrodes while the device and the substrate are in the liquid.

* * * * *